United States Patent
Yu et al.

(10) Patent No.: US 11,663,728 B2
(45) Date of Patent: May 30, 2023

(54) DEPTH ESTIMATION METHOD AND APPARATUS

(71) Applicant: Samsung Electronics Co., Ltd., Suwon-si (KR)

(72) Inventors: Jiaqian Yu, Beijing (CN); Jingtao Xu, Beijing (CN); Yiwei Chen, Beijing (CN); Byung In Yoo, Seoul (KR); Chang Kyu Choi, Seongnam-si (KR); Hana Lee, Suwon-si (KR); Jaejoon Han, Seoul (KR); Qiang Wang, Beijing (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 193 days.

(21) Appl. No.: 17/146,752

(22) Filed: Jan. 12, 2021

(65) Prior Publication Data

US 2021/0225018 A1     Jul. 22, 2021

(30) Foreign Application Priority Data

Jan. 16, 2020   (CN) .......................... 202010046284.3
Dec. 10, 2020   (KR) ........................ 10-2020-0172465

(51) Int. Cl.
*G06T 7/50*        (2017.01)
*H01L 27/146*      (2006.01)

(52) U.S. Cl.
CPC .......... *G06T 7/50* (2017.01); *H01L 27/14605* (2013.01); *G06T 2207/10024* (2013.01)

(58) Field of Classification Search
CPC ............. G06T 7/50; G06T 2207/10024; H01L 27/14605; H01L 27/14603; H01L 25/167

USPC ......................................................... 382/106
See application file for complete search history.

(56) References Cited

U.S. PATENT DOCUMENTS

| | | | |
|---|---|---|---|
| 8,860,871 B2 | 10/2014 | Aoki | |
| 9,858,673 B2* | 1/2018 | Ciurea | H04N 13/243 |
| 11,176,704 B2* | 11/2021 | Holzer | G06T 7/579 |
| 11,314,983 B2* | 4/2022 | Salah | G06V 10/764 |
| 2017/0295332 A1 | 10/2017 | Tang | |
| 2021/0279511 A1* | 9/2021 | Gordon | G06N 3/08 |

(Continued)

FOREIGN PATENT DOCUMENTS

| | | |
|---|---|---|
| JP | 2014-157338 A | 8/2014 |
| JP | 2015-207861 A | 11/2015 |

(Continued)

OTHER PUBLICATIONS

Wadhwa, Neal, et al., "Synthetic Depth-of-Field with a Single-Camera Mobile Phone", *ACM Transactions on Graphics (TOG)*, 37, 4, Jun. 11, 2018 (pp. 1-18).

(Continued)

*Primary Examiner* — Ali Bayat
(74) *Attorney, Agent, or Firm* — NSIP Law

(57) ABSTRACT

A depth estimation method and apparatus are provided. The depth estimation method includes obtaining an image from an image sensor comprising upper pixels, each comprising N sub-pixels, obtaining N sub-images respectively corresponding to the N sub-pixels from the image, obtaining a viewpoint difference between the N sub-images using a first neural network, and obtaining a depth map of the image based on the viewpoint difference using a second neural network.

20 Claims, 14 Drawing Sheets

(56) References Cited

U.S. PATENT DOCUMENTS

2021/0303824 A1* 9/2021 Guérin ...................... G06T 7/97
2021/0383167 A1* 12/2021 Chakravarty .......... G06V 10/82
2021/0392313 A1* 12/2021 Kimura .................... G06N 3/08

FOREIGN PATENT DOCUMENTS

| JP | 6271842 B2 | 1/2018 |
| WO | WO 2019/070299 A1 | 4/2019 |

OTHER PUBLICATIONS

"How to take portraits using Live Focus feature on Samsung Galaxy S10 Series?", *Samsung Electronics Co., Ltd.*, Mar. 6, 2019 (pp. 1-5).
Carroll, Paul., "Updated: Huawei P30 Pro camera review", *Dxomark*, Sep. 18, 2019 (pp. 1-43).

* cited by examiner

DEPTH ESTIMATION METHOD AND APPARATUS

CROSS-REFERENCE TO RELATED APPLICATIONS

This application claims the benefit under 35 USC 119(a) of Chinese Patent Application No. 202010046284.3, filed on Jan. 16, 2020, in the China National Intellectual Property Administration and Korean Patent Application No. 10-2020-0172465, filed on Dec. 10, 2020, in the Korean Intellectual Property Office, the entire disclosures of which are incorporated herein by reference for all purposes.

BACKGROUND

Field

The following description relates to image processing, and a method and apparatus for estimating a depth.

Description of Related Art

A depth of field refers to a distance range between a foreground and a background of an object that is captured by a camera. For example, if a person is photographed, a person's focus becomes sharper and a background beyond the range of the depth of field becomes blurred as the depth of field decreases, and accordingly an effect of emphasizing the person may appear. In another example, when a landscape with a person is photographed, both the person and a background may become sharper as the depth of field increases. However, since it is difficult for a camera of a portable terminal to obtain the same level of an aperture and a focal length as those of a professional camera due to hardware limitations, and since it is difficult to achieve various effects of the depth of field, these effects may be achieved through an algorithm.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a depth estimation method including obtaining an image from an image sensor comprising upper pixels, each comprising N sub-pixels, obtaining N sub-images respectively corresponding to the N sub-pixels from the image, obtaining a viewpoint difference between the N sub-images using a first neural network, and obtaining a depth map of the image based on the viewpoint difference using a second neural network.

The obtaining of the viewpoint difference may include pairing the N sub-images, and obtaining a viewpoint difference between the paired sub-images.

The obtaining of the viewpoint difference between the paired sub-images may include obtaining a difference value of sub-pixels at corresponding positions between the paired sub-images, and obtaining the viewpoint difference between the paired sub-images based on the difference value.

The obtaining of the viewpoint difference between the paired sub-images may include performing a convolution operation on each of the paired sub-images, obtaining a difference value of sub-pixels at corresponding positions between result images obtained by performing the convolution operation, and obtaining the viewpoint difference between the paired sub-images based on the difference value.

The obtaining of the viewpoint difference between the paired sub-images may include performing a shift operation on each of the paired sub-images, obtaining a difference value of sub-pixels at corresponding positions between result images obtained by performing the shift operation, and obtaining the viewpoint difference between the paired sub-images based on the difference value.

The obtaining of the viewpoint difference between the paired sub-images may include performing a shift operation on each of the paired sub-images, performing a convolution operation on each of result images obtained by performing the shift operation, obtaining a difference value of sub-pixels at corresponding positions between result images obtained by performing the convolution operation, and obtaining the viewpoint difference between the paired sub-images based on the difference value.

The depth estimation method may include obtaining an edge detection diagram based on the depth map of the image using a third neural network.

The depth estimation method may include obtaining an image segmentation diagram based on the depth map of the image using a fourth neural network.

The shift operation may be performed to apply a value of a shift in a same direction or a value of a shift in a different direction to each of the paired sub-images.

N may be equal to "4", four sub-pixels included in each of the upper pixels may be disposed in an upper left end, a lower left end, an upper right end and a lower right end of each of the upper pixels, and the four sub-images may include a sub-image corresponding to an upper left sub-pixel, a sub-image corresponding to a lower left sub-pixel, a sub-image corresponding to an upper right sub-pixel, and a sub-image corresponding to a lower right sub-pixel.

In another general aspect, there is provided a depth estimation apparatus including an image sensor comprising a plurality of upper pixels, each comprising N sub-pixels, and the image sensor being configured to obtain an image, and a processor configured to obtain N sub-images respectively corresponding to the N sub-pixels from the image, obtain a viewpoint difference between the N sub-images using a first neural network, and obtain a depth map of the image based on the viewpoint difference using a second neural network.

The processor may be configured to pair the N sub-images, and obtain a viewpoint difference between the paired sub-images.

The processor may be configured to obtain a difference value of sub-pixels at corresponding positions between the paired sub-images, and obtain the viewpoint difference between the paired sub-images based on the difference value.

The processor may be configured to perform a convolution operation on each of the paired sub-images, obtain a difference value of sub-pixels at corresponding positions between result images obtained by performing the convolution operation, and obtain the viewpoint difference between the paired sub-images based on the difference value.

The processor may be configured to perform a shift operation on each of the paired sub-images, obtain a difference value of sub-pixels at corresponding positions between result images obtained by performing the shift operation, and obtain the viewpoint difference between the paired sub-images based on the difference value.

The processor may be configured to perform a shift operation on each of the paired sub-images, perform a convolution operation on each of result images obtained by performing the shift operation, obtain a difference value of sub-pixels at corresponding positions between result images obtained by performing the convolution operation, and obtain the viewpoint difference between the paired sub-images based on the difference value.

The processor may be configured to obtain an edge detection diagram based on the depth map of the image using a third neural network.

The processor may be configured to obtain an image segmentation diagram based on the depth map of the image using a fourth neural network.

The shift operation may be performed to apply a value of a shift in a same direction or a value of a shift in a different direction to each of the paired sub-images.

Other features and aspects will be apparent from the following detailed description, the drawings, and the claims.

Figure 1A:
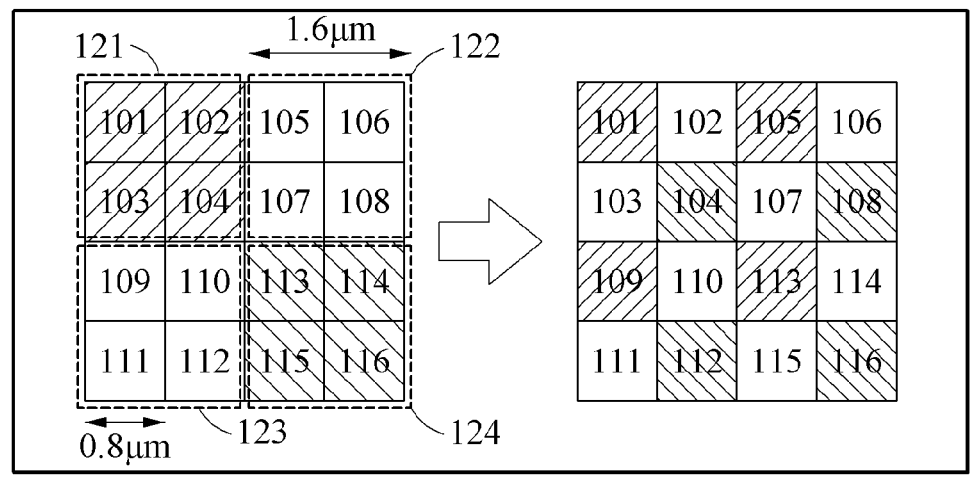
FIGS. 1A and 1B illustrate an example of an image sensor used by a depth estimation apparatus.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the concept of the present disclosure.

It will be understood that when a component is referred to as being "connected to" another component, the component can be directly connected or coupled to the other component or intervening components may be present.

As used herein, the singular forms are intended to include the plural forms as well, unless the context clearly indicates otherwise. As used herein, the term "and/or" includes any one and any combination of any two or more of the associated listed items. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Hereinafter, examples will be described in detail with reference to the accompanying drawings, and like reference numerals in the drawings refer to like elements throughout.

Figure 1B:
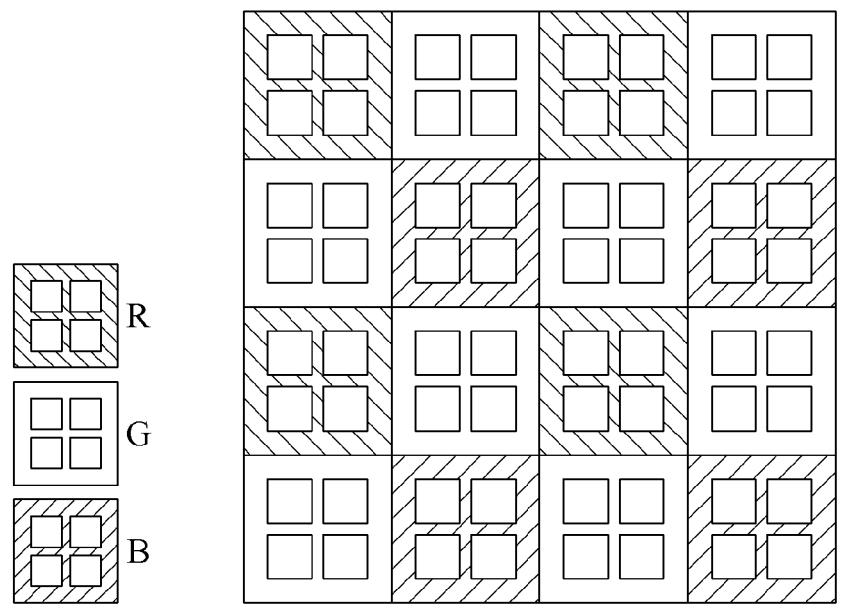
Figure 2:
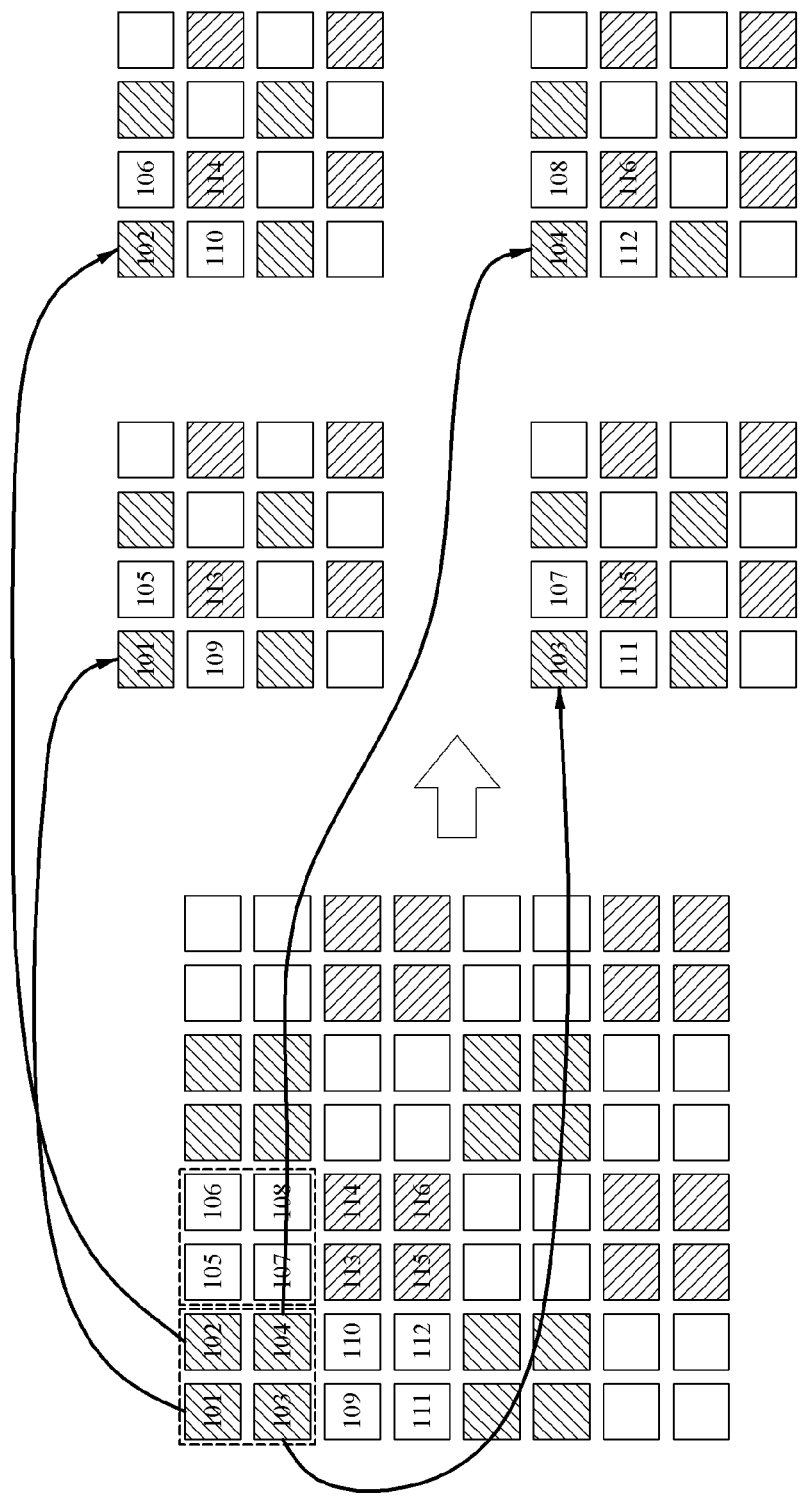
FIG. 2 illustrates an example of a process of obtaining a sub-image by a depth estimation apparatus.

FIGS. 1A and 1B illustrate an example of an image sensor used by a depth estimation apparatus. FIG. 2 illustrates an example of a process of obtaining a sub-image by a depth estimation apparatus.

The depth estimation apparatus may obtain an original image from the image sensor. The depth estimation apparatus may obtain a plurality of sub-images from the original image. The depth estimation apparatus may obtain a viewpoint difference between the sub-images from the sub-images. The depth estimation apparatus may obtain a depth map of the original image based on the viewpoint difference.

In an example, the depth estimation apparatus may obtain the original image from the image sensor. The image sensor may include a plurality of upper pixels. Each of the upper pixels may include a plurality of sub-pixels. For example, the image sensor may include a camera having a phase detection function or a phase autofocus function. In an example, the camera may be disposed in a portable terminal. For example, the image sensor may implement a phase detection function by a full pixel multi-core technology. The full pixel multi-core technology may include, for example, a full pixel dual-core or a full pixel quad-core. A commercially available technology such as, for example, Quad Bayer technology or Tetracell technology may be applied to the image sensor. An image sensor with a full pixel quad-core camera may include four sub-pixels for each upper pixel.

Referring to FIGS. 1A and 1B, the image sensor may be an image sensor with a full pixel quad-core camera. Empty boxes or boxes with diagonal lines of FIGS. 1A and 1B represent a Bayer pattern (for example, an RGGB array) applied to the image sensor. The Bayer pattern may generate channel information about three channels (for example, R, G and B channels) for each upper pixel. An upper pixel of each channel may include four sub-pixels of 2×2, and a Bayer pattern applied to each sub-pixel may be a quadruple Bayer pattern.

As shown in a left portion of FIG. 1A, an upper pixel 121 represents a B channel and includes sub-pixels 101, 102, 103 and 104. Upper pixels 122 and 123 represent a G channel, the upper pixel 122 includes sub-pixels 105, 106, 107 and 108, and the upper pixel 123 includes sub-pixels 109, 110, 111 and 112. An upper pixel 124 represents an R channel and includes sub-pixels 113, 114, 115 and 116. Upper pixels may include sub-pixels of the same channel. A relatively large amount of light may be received through the sub-pixels of the same channel in a low illuminance environment.

A right portion of FIG. 1A illustrates a state in which an array is converted for the quadruple Bayer pattern. Upper pixels may include sub-pixels of different channels. Accordingly, a high-resolution Bayer pattern may be applied to the image sensor. A sufficiently large amount of light may be received in a relatively high illuminance environment, and thus a high-resolution image may be obtained through the high-resolution Bayer pattern.

FIG. 1B illustrates a portion of an image sensor including upper pixels with a Bayer pattern of the left portion of FIG. 1A. The image sensor may have a general Bayer pattern for a plurality of upper pixels, and each of the upper pixels may include sub-pixels of the same channel. The sub-pixel 101 of the R channel, the sub-pixels 102 and 103 of the G channel, and the sub-pixel 104 of the B-channel may form a unit pattern of a more precise Bayer pattern. In this way, the sub-pixels 101 through 116 may form unit patterns of the more precise Bayer pattern.

Next, the depth estimation apparatus may obtain a plurality of sub-images from the original image. The depth estimation apparatus may process the original image according to a rule of the Bayer pattern to obtain the plurality of sub-images. The depth estimation apparatus may synthesize the plurality of sub-images from the original image through sub-pixels in positions corresponding to each other included in all upper pixels. A sub-image may be referred to as a phase map. Also, the positions corresponding to each other may be relative positions of sub-pixels of each upper pixel.

For example, a camera with a phase autofocus function may capture the same scene and provide images represented in various schemes, for example, a color image (for example, an RGB image) or a phase image. The RGB image may be a typical output image, a pixel value of each upper pixel in a final image may be derived from information on the three primary RGB colors of a Bayer pattern, and information of each of three RGB channels may include a difference value of a plurality of sub-pixels. The phase image may include a greyscale map that is a single channel, and may directly indicate an original upper pixel value. The depth estimation apparatus may separate the same number of sub-images as sub-pixels in the Bayer pattern. In an example of a quadruple Bayer pattern to which the full pixel quad-core technology is applied, four sub-images may be separated.

Referring to FIG. 2, when an image is obtained using a full pixel quad-core camera, the depth estimation apparatus may obtain four sub-images. The depth estimation apparatus may synthesize sub-pixels 101, 102, 103 and 104 located in an upper left end of each upper pixel into upper left sub-images, respectively. The depth estimation apparatus may synthesize sub-pixels 109, 110, 111 and 112 located in a lower left end of each upper pixel into lower left sub-images, respectively. The depth estimation apparatus may synthesize sub-pixels 105, 106, 107 and 108 located in an upper right end of each upper pixel into upper right sub-images, respectively. The depth estimation apparatus may synthesize sub-pixels 113, 114, 115 and 116 located in a lower right end of each upper pixel into lower right sub-images, respectively.

The depth estimation apparatus may obtain a viewpoint difference between the sub-images. The depth estimation apparatus may pair two sub-images and may obtain a viewpoint difference between the paired sub-images. The depth estimation apparatus may input the paired sub-images to a first neural network and may calculate the viewpoint difference.

The depth estimation apparatus may obtain a depth map of the original image based on the viewpoint difference. The depth estimation apparatus may input a viewpoint difference between sub-images to a second neural network, may estimate a depth of the original image, and may obtain the depth map of the original image. The second neural network may be, for example, a convolutional neural network (CNN). When a parameter of a camera is fixed, a depth and a viewpoint difference may correspond to each other in positions of objects in different distances from the camera. Thus, the depth estimation apparatus may obtain the depth map based on an order of depth values of the objects based on the viewpoint difference.

Figure 3:
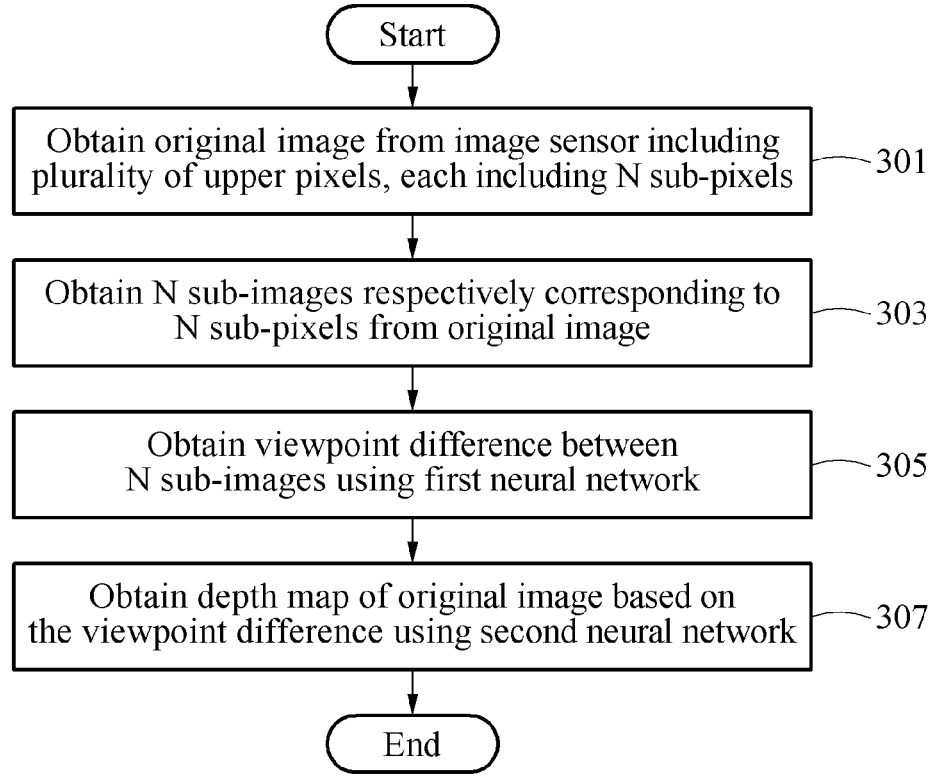
FIG. 3 is a diagram illustrating an example of a depth estimation method.

FIG. 3 illustrates an example of a depth estimation method. The operations in FIG. 3 may be performed in the sequence and manner as shown, although the order of some operations may be changed or some of the operations omitted without departing from the spirit and scope of the illustrative examples described. Many of the operations shown in FIG. 3 may be performed in parallel or concurrently. One or more blocks of FIG. 3, and combinations of the blocks, can be implemented by special purpose hardware-based computer, such as a processor, that perform the specified functions, or combinations of special purpose hardware and computer instructions. In addition to the description of FIG. 3 below, the descriptions of FIGS. 1-2 are also applicable to FIG. 3, and are incorporated herein by reference. Thus, the above description may not be repeated here.

Referring to FIG. 3, in operation 301, a depth estimation apparatus may obtain an original image from an image sensor. The image sensor may include a plurality of upper pixels and each of the upper pixels may include "N" sub-pixels.

In operation 303, the depth estimation apparatus may obtain "N" sub-images respectively corresponding to the "N" sub-pixels from the original image. For example, "N" may be "4", and four sub-pixels included in each of the upper pixels may be disposed in an upper left end, a lower left end, an upper right end and a lower right end of each of the upper pixels. The "N" sub-images may include a sub-image corresponding to an upper left sub-pixel, a sub-image corresponding to a lower left sub-pixel, a sub-image corresponding to an upper right sub-pixel, and a sub-image corresponding to a lower right sub-pixel.

In operation 305, the depth estimation apparatus may obtain a viewpoint difference between the "N" sub-images using a first neural network. The depth estimation apparatus may pair the "N" sub-images. The depth estimation apparatus may obtain a viewpoint difference between the paired sub-images.

In an example, the depth estimation apparatus may obtain a difference value of sub-pixels at corresponding positions between paired sub-images. The depth estimation apparatus may obtain a viewpoint difference between the paired sub-images based on the difference value of sub-pixels at corresponding positions between paired sub-images.

In another example, the depth estimation apparatus may perform a convolution operation on each of paired sub-images. The depth estimation apparatus may obtain a difference value of sub-pixels at corresponding positions between result images obtained by performing the convolution operation. The depth estimation apparatus may obtain a viewpoint difference between the paired sub-images based on the difference value of sub-pixels at corresponding positions.

In another example, the depth estimation apparatus may perform a shift operation on each of paired sub-images. The depth estimation apparatus may obtain a difference value of sub-pixels at corresponding positions between result images obtained by performing the shift operation. The depth estimation apparatus may obtain a viewpoint difference between the paired sub-images based on the difference value. The shift operation may be an operation of applying a value of a shift in the same direction or a value of a shift in a different direction to each of the paired sub-images.

In another example, the depth estimation apparatus may perform a shift operation on each of paired sub-images. The depth estimation apparatus may perform a convolution operation on each of result images obtained by performing the shift operation. The depth estimation apparatus may obtain a difference value of sub-pixels at corresponding positions between result images obtained by performing the convolution operation. The depth estimation apparatus may obtain a viewpoint difference between the paired sub-images based on the difference value.

In operation 307, the depth estimation apparatus may obtain a depth map of the original image based on the viewpoint difference using a second neural network. For example, the depth estimation apparatus may obtain an edge detection diagram based on the depth map of the original image using a third neural network. The depth estimation apparatus may obtain an image segmentation diagram based on the depth map of the original image using a fourth neural network.

Figure 4:
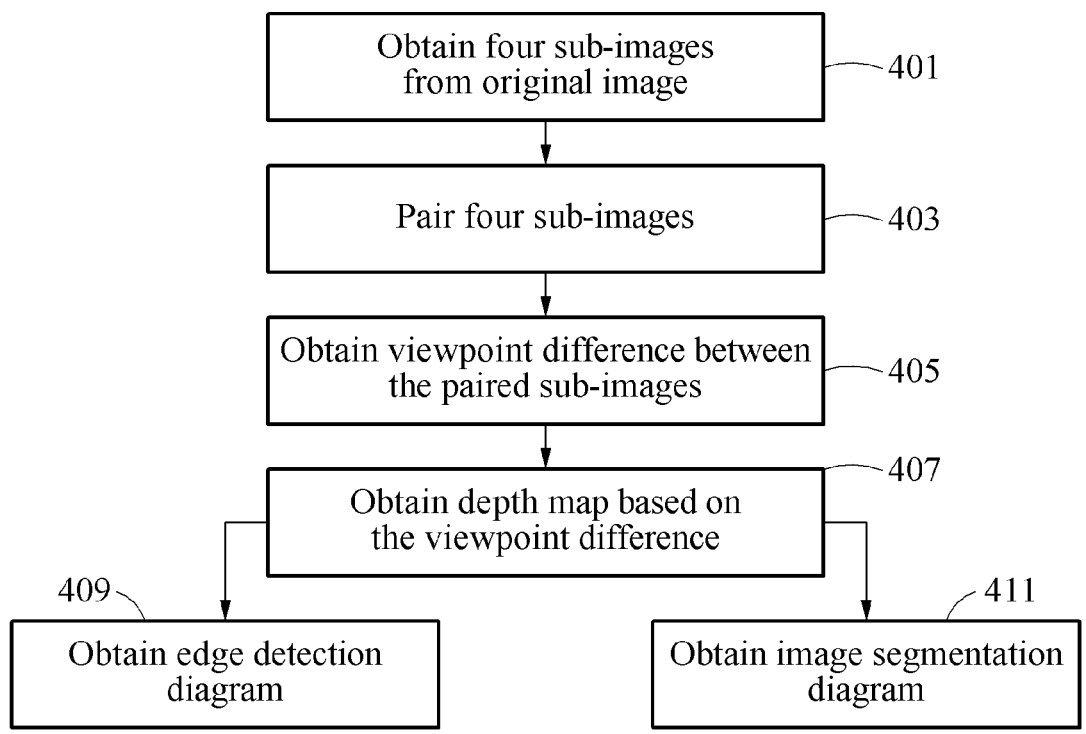
FIG. 4 illustrates an example of a depth estimation method.

FIG. 4 illustrates an example of a depth estimation method. The operations in FIG. 4 may be performed in the sequence and manner as shown, although the order of some operations may be changed or some of the operations omitted without departing from the spirit and scope of the illustrative examples described. Many of the operations shown in FIG. 4 may be performed in parallel or concurrently. One or more blocks of FIG. 4, and combinations of the blocks, can be implemented by special purpose hardware-based computer, such as a processor, that perform the specified functions, or combinations of special purpose hardware and computer instructions. In addition to the description of FIG. 4 below, the descriptions of FIGS. 1-3 are also applicable to FIG. 4, and are incorporated herein by reference. Thus, the above description may not be repeated here.

Referring to FIG. 4, in operation 401, a depth estimation apparatus may obtain four sub-images from an original image. In operation 403, the depth estimation apparatus may pair the four sub-images. In operation 405, the depth estimation apparatus may obtain a viewpoint difference between the paired sub-images using a first neural network. In operation 407, the depth estimation apparatus may obtain a depth map based on the viewpoint difference using a second neural network.

In operation 409, the depth estimation apparatus may obtain an edge detection diagram based on the depth map using a third neural network. In operation 411, the depth estimation apparatus may obtain an image segmentation diagram based on the depth map using a fourth neural network. The third neural network and the fourth neural network may correspond to a decoder in an encoder-decoder structure, and the decoder may decode information from among features extracted from input data and may output a final result.

The decoder may have a structure independent of the first neural network and the second neural network and may receive output results of the first neural network and the second neural network. When the first neural network, the second neural network and the decoder are independent of each other, the first neural network, the second neural network and the decoder may be simultaneously or sequentially trained through multi-task learning in a learning process.

Figure 5:
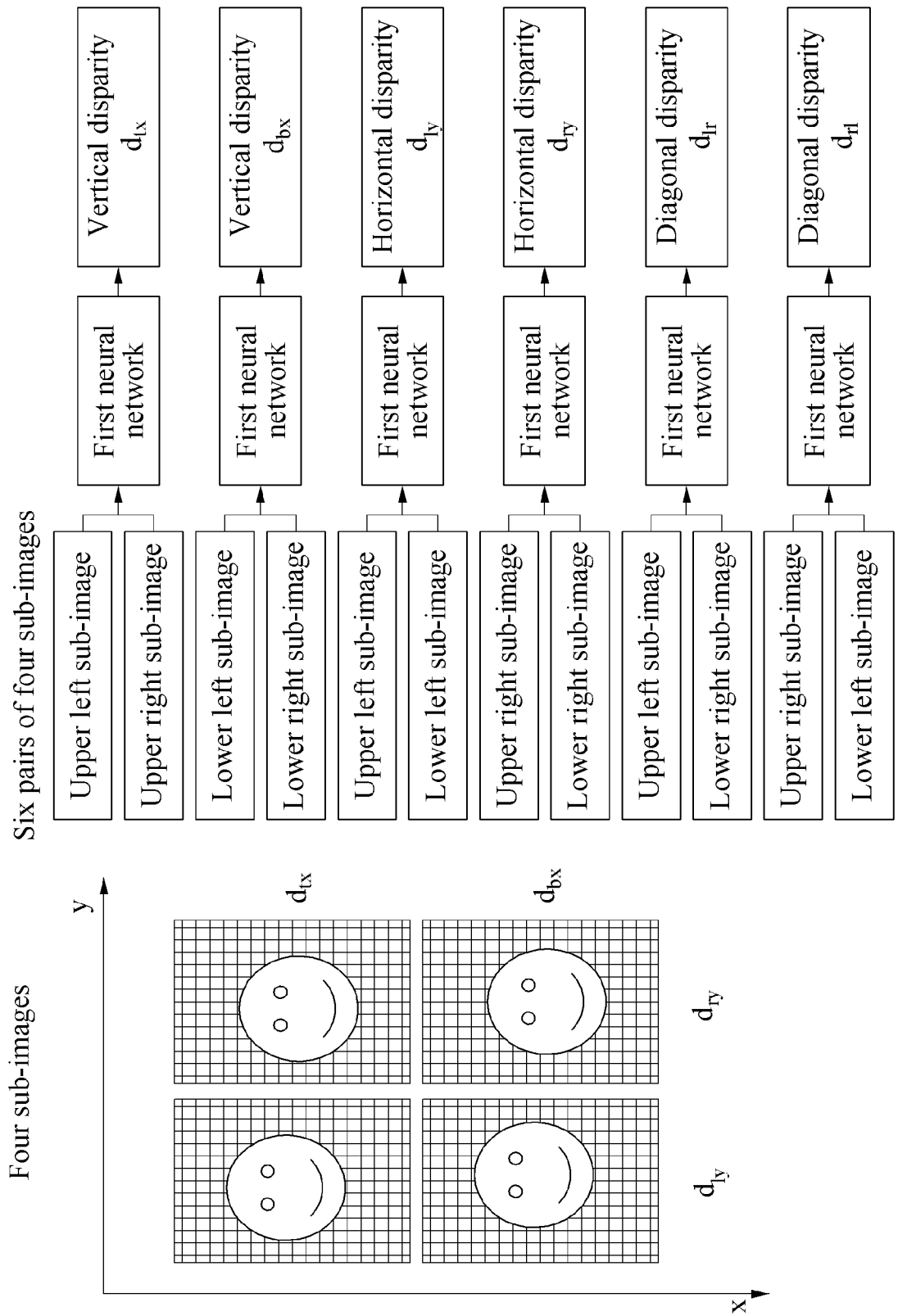
FIG. 5 illustrates an example of a process of obtaining a viewpoint difference from sub-images by a depth estimation apparatus.

FIG. 5 illustrates an example of a process of obtaining a viewpoint difference from sub-images by a depth estimation apparatus.

FIG. 5 illustrates a process by which the depth estimation apparatus calculates a viewpoint difference between a plurality of sub-images. The sub-images may include an upper left sub-image, a lower left sub-image, an upper right sub-image and a lower right sub-image.

The depth estimation apparatus may pair sub-images in all cases. The depth estimation apparatus may pair the upper left sub-image and the upper right sub-image. The depth estimation apparatus may pair the lower left sub-image and the lower right sub-image. The depth estimation apparatus may pair the upper left sub-image and the lower left sub-image. The depth estimation apparatus may pair the upper right sub-image and the lower right sub-image. The depth estimation apparatus may pair the upper left sub-image and the lower right sub-image. The depth estimation apparatus may pair the upper right sub-image and the lower left sub-image.

The depth estimation apparatus may input the paired sub-images to the first neural network. The first neural network may be pre-trained to derive a viewpoint difference from a pair of sub-images through training data.

The first neural network may output a vertical disparity $d_{tx}$ from the upper left sub-image and the upper right sub-image. The first neural network may output a vertical disparity $d_{bx}$ from the lower left sub-image and the lower right sub-image. The first neural network may output a horizontal disparity $d_{iy}$ from the upper left sub-image and lower left sub-image. The first neural network may output a horizontal disparity $d_{ry}$ from the upper right sub-image and the lower right sub-image. The first neural network may output a diagonal disparity $d_{tr}$ from the upper left sub-image and the lower right sub-image. The first neural network may output a diagonal disparity $d_{rl}$ from the upper right sub-image and the lower left sub-image.

Figure 7:
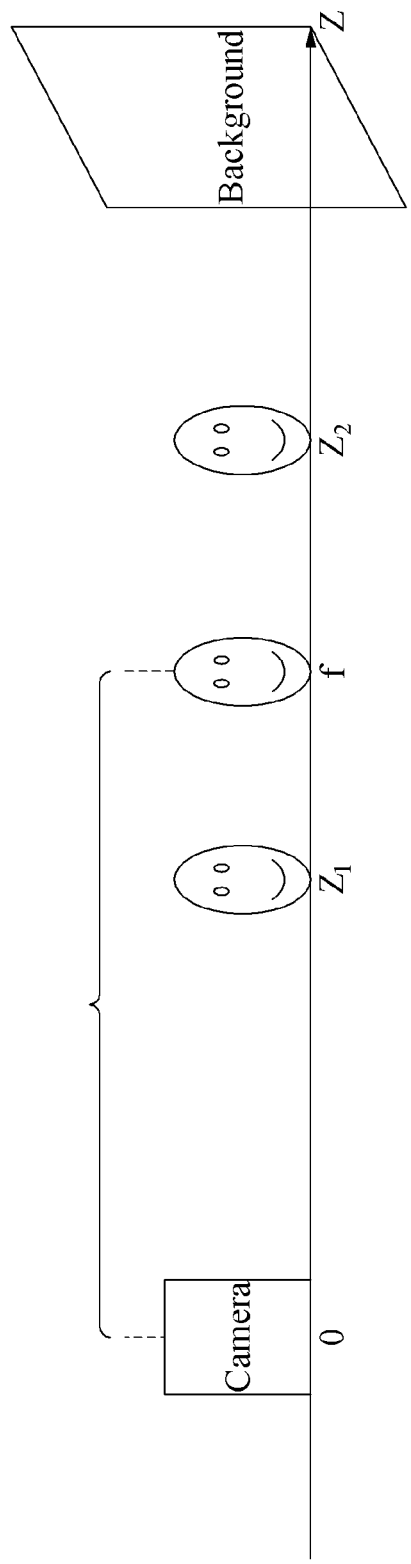
FIG. 7 illustrates an example of objects at different distances from a camera.
Figure 8:
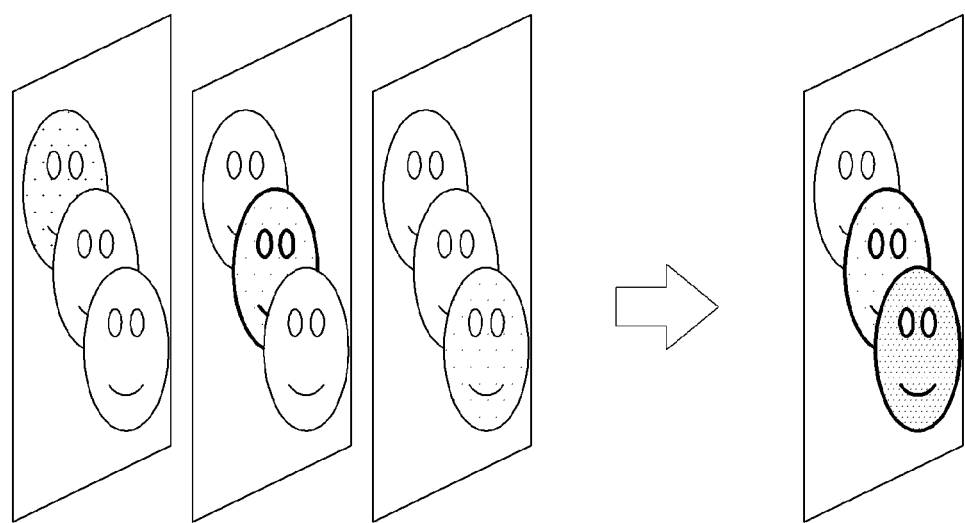
FIG. 8 illustrates an example of a composite depth map.

FIGS. 6A through 6D illustrate examples of obtaining a viewpoint difference. FIG. 7 illustrates an example of objects at different distances from a camera. FIG. 8 illustrates an example of a composite depth map.

Figure 6A:
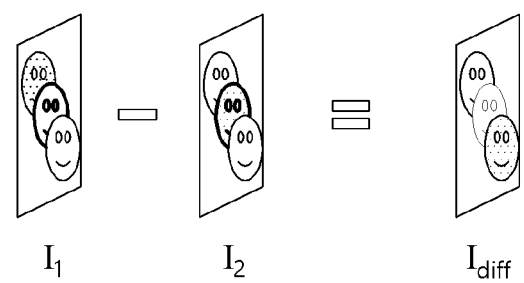
FIGS. 6A through 6D illustrate examples of obtaining a viewpoint difference.

Referring to FIG. 6A, a depth estimation apparatus may obtain a difference value Idiff of sub-pixels at corresponding positions between paired sub-images I1 and I2. The depth estimation apparatus may output a greater value of a difference value between the sub-images I1 and I2 and a threshold α as the difference value Idiff according to Equation 1 shown below. In this example, a may have a value of "0", which may indicate that a difference value Idiff of sub-pixels at corresponding positions between sub-images I1 and I2 is a positive value in Equation 1.

Figure 6B:
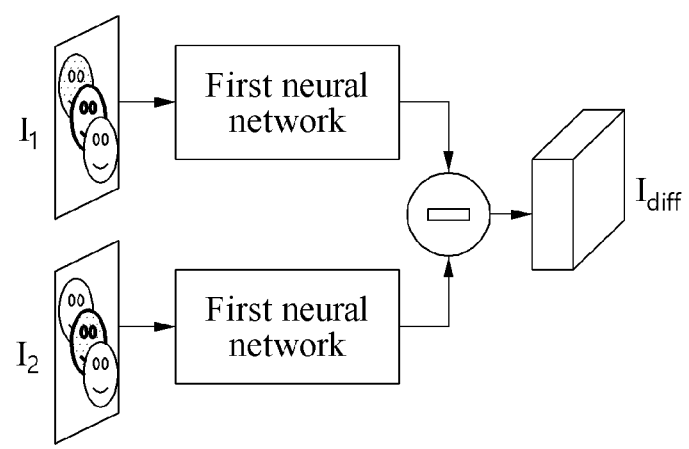

Referring to FIG. 6B, the depth estimation apparatus may perform a convolution operation on each of paired sub-images I1 and I2 using a first neural network. The depth estimation apparatus may obtain a difference value Idiff of sub-pixels at corresponding positions between result images obtained by performing the convolution operation. The depth estimation apparatus may output a greater value of a difference value between the sub-images I1 and I2, on which the convolution operation is performed, and the threshold a as the difference value Idiff according to Equation 2 shown below.

Figure 6C:
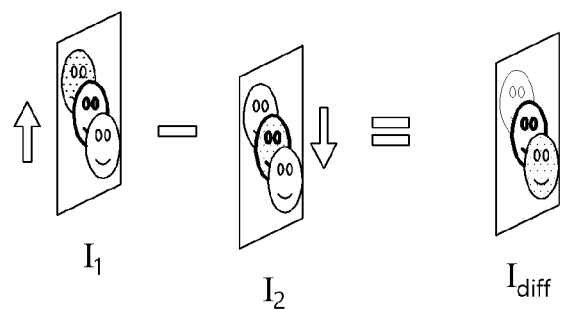

Referring to FIG. 6C, the depth estimation apparatus may perform a shift operation on each of paired sub-images I1 and I2. The depth estimation apparatus may obtain a difference value Idiff of sub-pixels at corresponding positions between result images obtained by performing the shift operation. The shift operation may be an operation of applying a value of a shift in the same direction or a value of a shift in a different direction to each of paired sub-images. The depth estimation apparatus may output a greater value of a difference value between the sub-images I1 and I2, on which the shift operation is performed, and the threshold α as the difference value Idiff according to Equation 3 shown below.

Figure 6D:
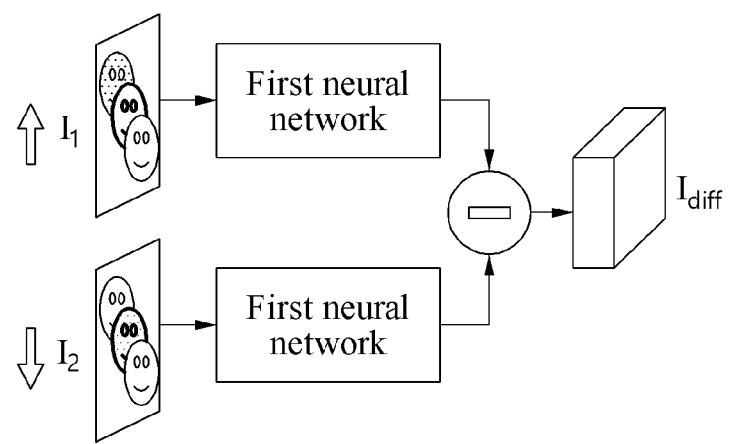

Referring to FIG. 6D, the depth estimation apparatus may perform a shift operation on each of paired sub-images I1 and I2 using the first neural network. The depth estimation apparatus may perform a convolution operation on each of result images obtained by performing the shift operation. The depth estimation apparatus may obtain a difference value Idiff of sub-pixels at corresponding positions between result images obtained by performing the convolution operation. The depth estimation apparatus may output a greater value of a difference value between the sub-images I1 and I2, on which the shift operation and the convolution operation are sequentially performed, and the threshold α as the difference value Idiff according to Equation 1 shown below.

In Equations 1 through 4, max denotes a maximum value, and α denotes a constant, which is merely an example and is not limited, and may be "0". Also, conv denotes a convolution operation, shift denotes a shift operation, and d denotes a shift value of the shift operation and is a constant.

$$Idiff = \max(\alpha, I1-I2) \quad \text{[Equation 1]}$$

$$Idiff = \max(\alpha, conv(I1) - conv(I2)) \quad \text{[Equation 2]}$$

$$Idiff = \max(\alpha, shift(I1, 1/2d) - shift(I2, -1/2d)) \quad \text{[Equation 3]}$$

$$Idiff = \max(\alpha, conv(shift(I1, 1/2d)) - conv(shift(I2, -1/2d))) \quad \text{[Equation 4]}$$

In FIG. 7, D(z) is used to represent a viewpoint difference between two sub-images representing an object S when the object S is at a distance z, and f represents a focal length of a camera. It may be found that if "D(f)=0", "D(z)≠0" at an arbitrary distance z of "z≠f", and "$z_1 < f < z_2$" are satisfied, $D(z_1) < D(f) = 0 < D(z_2)$ may be satisfied. Thus, the depth estimation apparatus may obtain a relative depth of an object included in an image through a relationship of a viewpoint difference, and may obtain a relative depth map.

For example, when a viewpoint difference is "0", an object is at the same position in two sub-images that are paired, and there is no viewpoint difference. An image feature of the position of the object may be greatly reduced. Referring to FIG. 7, an object located in the middle is at a position where a viewpoint difference is "0", and an image feature of the object in a viewpoint difference map is greatly reduced.

The composite depth map of FIG. 8 may be generated by the depth estimation apparatus. As shown in FIG. 8, the depth estimation apparatus may obtain a relative depth map of an image based on a relative relationship between viewpoints of objects. Also, according to a one-to-one correspondence relationship between a viewpoint difference and a depth value, the depth estimation apparatus may obtain an absolute depth map of the image.

Figure 9:
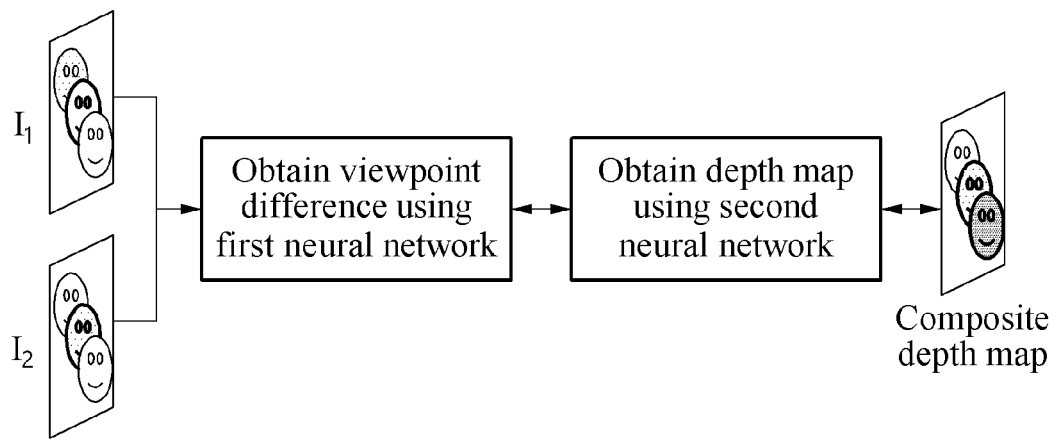
FIG. 9 illustrates an example of an overall depth estimation method.

FIG. 9 illustrates an example of an overall depth estimation method.

As shown in FIG. 9, a depth estimation apparatus may calculate a viewpoint difference using a first neural network and may estimate a depth using a second neural network, to obtain a depth map.

The first neural network and the second neural network may be trained in an end-to-end manner using a training sub-image and a training depth map. Since there is no calibration data for a viewpoint difference in a training process, the first neural network and the second neural network may be simultaneously trained. However, the first neural network and the second neural network may not need to have the same network structure and may not share a parameter.

Figure 10A:
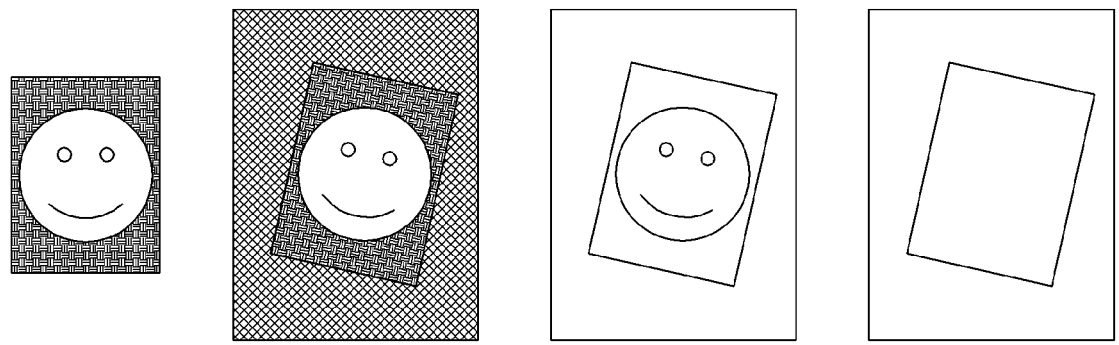
FIGS. 10A through 10C illustrate an example of edge extraction of a third neural network.
Figure 10B:
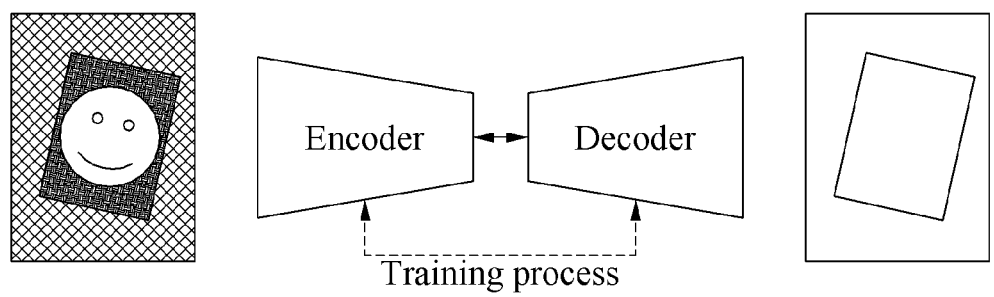
Figure 10C:
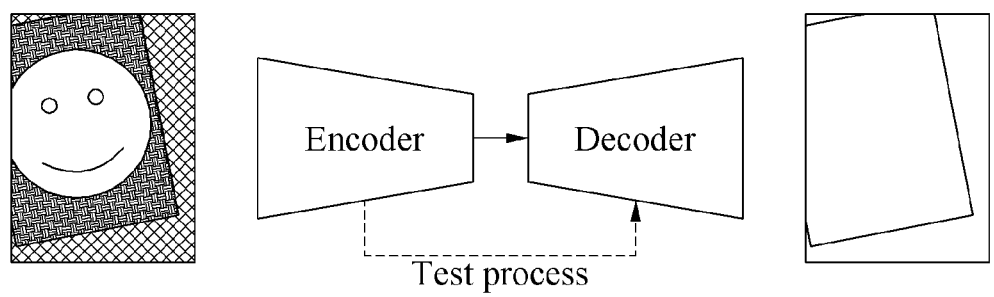

FIGS. 10A through 10C illustrate an example of edge extraction of a third neural network.

A depth estimation apparatus may obtain an edge detection diagram of an original image based on a plurality of sub-images. The depth estimation apparatus may obtain the edge detection diagram of the original image based on a viewpoint difference between sub-images. The depth estimation apparatus may input the plurality of sub-images to the third neural network and may obtain the edge detection diagram of the original image.

The third neural network may be, for example, a CNN. In a process of training the third neural network, a multi-task training scheme may be used to enhance extraction performance of edge detection for the original image of the third neural network. Since the edge detection for the original image is an important function in a computer vision, a viewpoint difference feature of edges is relatively clear in a depth estimation operation of a viewpoint difference map in many cases. Through the multi-task training scheme, performance of a second neural network and the third neural network for extracting effective features may be enhanced. For example, when a viewpoint difference between sub-images is obtained, a difference in displacement between a foreground and a background may be clearly observed. It may be difficult to train an edge detection function at a desired level when end-to-end training is performed by directly using a deep neural network (DNN). However, when supervised learning using an edge map for the foreground and background during training is applied, the third neural network may be trained with a relatively high accuracy.

In an example, the third neural network may be trained using an off-shelf scheme, and the third neural network and the second neural network may not be simultaneously trained. Also, a data set used to train the third neural network may not need to be identical to a data set for the second neural network. When a monochromatic image of RGB channels, the third neural network may output an edge detection diagram of an original image. A training apparatus may synthesize an edge detection diagram for a boundary of front and rear background images using an artificial composite image and may train the third neural network, and may generate front and rear background images and a front and back background image detection diagram depending on circumstances.

FIG. 10A illustrates, from left to right, a template image including a face, an image including a face in a real scene, an edge detection result for a whole scene obtained by applying an existing edge detection algorithm, and an edge detection result for a whole scene obtained by a depth estimation apparatus.

As shown in FIG. 10B, in a process of training the third neural network, the training apparatus may input an artificial composite color image to the third neural network, the third neural network may output an edge detection diagram, and an output result may be compared to correct answer data to calculate a loss value. The third neural network may be trained to reduce the loss value.

As shown in FIG. 10C, the trained third neural network may extract an effective edge feature estimated from a real image. In a test process, the depth estimation apparatus may input a color image representing a real scene to the third neural network, and the third neural network may output an edge detection diagram.

Figure 11:
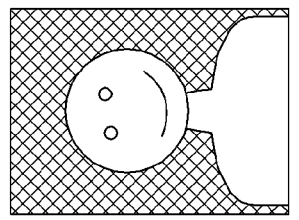
FIG. 11 illustrates an example of an image segmentation of a fourth neural network.
Figure 11:
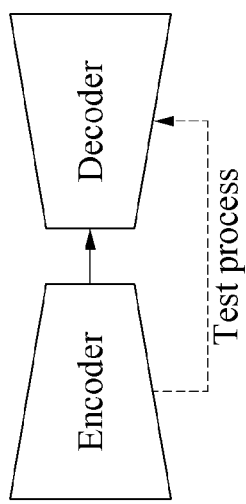
Figure 11:
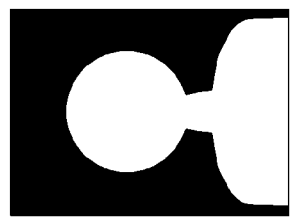
Figure 11:
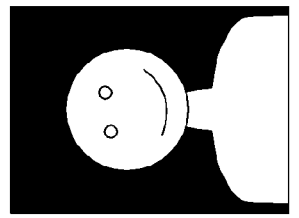

FIG. 11 illustrates an example of an image segmentation of a fourth neural network.

Referring to FIG. 11, a depth estimation apparatus may obtain an image segmentation diagram based on a plurality of sub-images. The depth estimation apparatus may also obtain the image segmentation diagram based on a viewpoint difference between sub-images. Also, the depth estimation apparatus may obtain the image segmentation diagram based on a depth map. The depth estimation apparatus may input the plurality of sub-images to the fourth neural network and may obtain the image segmentation diagram. The fourth neural network may be, for example, a CNN. Similarly to edge detection, in a process of obtaining a depth based on a viewpoint difference, foreground segmentation may help the fourth neural network to enhance an efficiency of extracting effective image features. Similarly to an edge detection process, the fourth neural network may be trained using an off-shelf scheme. For example, in response to an input of a color image, the fourth neural network may output an image segmentation diagram.

Figure 12:
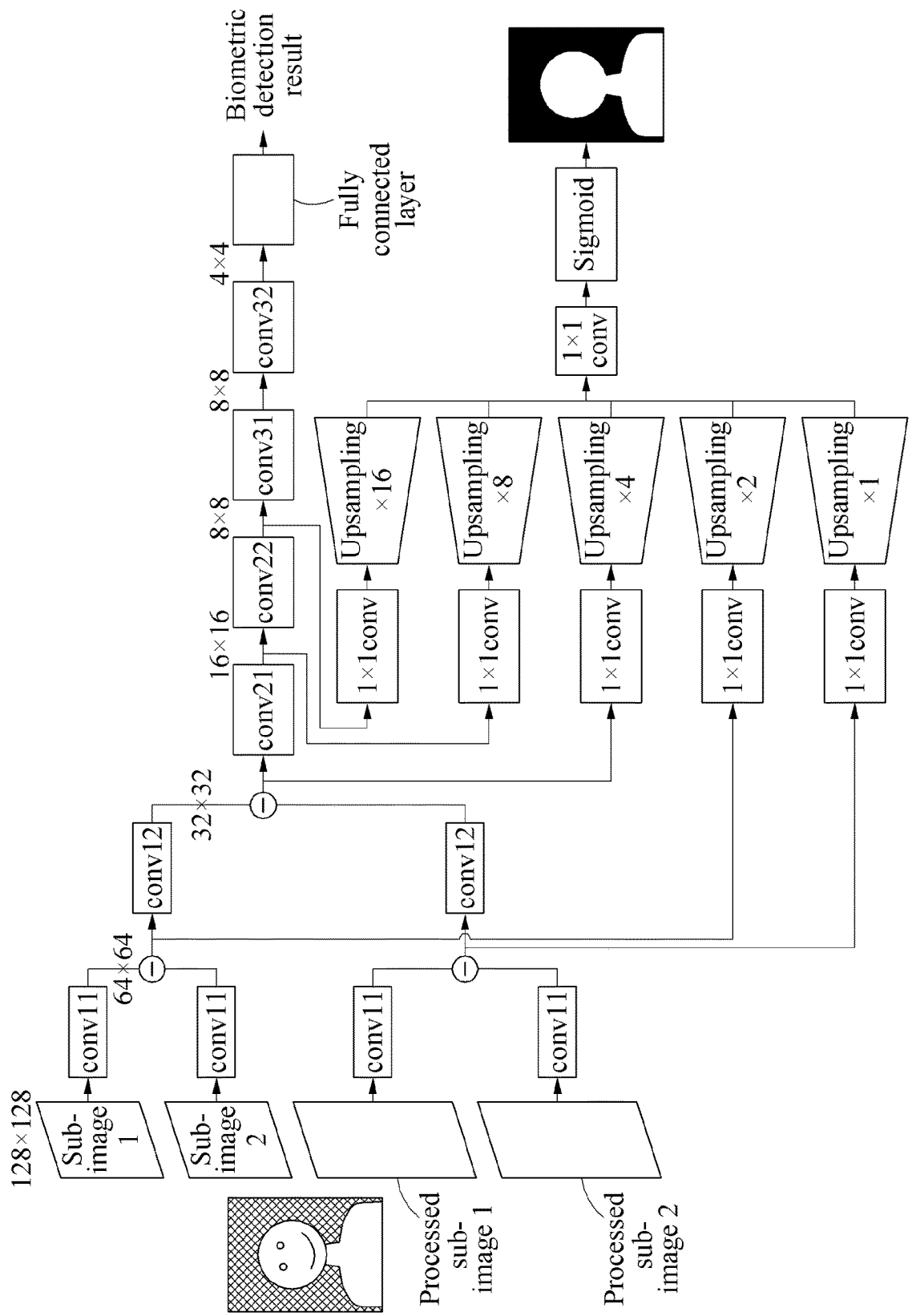
FIG. 12 illustrates an example of a multi-task learning network.

FIG. 12 illustrates an example of a multi-task learning network.

In FIG. 12, cony represents a convolution operation, and although not shown in FIG. 12, the multi-task learning network may include shift processing. Each of sub-images 1 and 2 may be input to convolution 11, and each of sub-images 1 and 2, hereinafter referred to as processed sub-images 1 and 2, obtained after shift processing may be input to convolution 11. Convolution results of a pair of the sub-images 1 and 2 may be differenced, convolution results of a pair of the processed sub-images 1 and 2 may be differenced, each of results of the differencing may be input to convolution 12, and differencing may be performed again. A result of the differencing for convolution 12 may pass through convolution 21, convolution 22, convolution 31, convolution 32 and a fully connected layer, and thus a biometric detection result may be derived.

A depth estimation apparatus may distinguish real face data in three-dimension (3D) from fake face data in two-dimension (2D) based on a biometric detection result to which a full pixel quad-core technology is applied. Since the real face data includes depth information and the fake face data does not include depth information, the depth estimation apparatus may provide improved the biometric detection result.

The results of the differencing for convolution 11, the result of the differencing for convolution 12, a result of convolution 21, and a result of convolution 22 may be upsampled to various scales through 1×1 convolution. Each upsampling result may pass through 1×1 convolution and a sigmoid function. Finally, an image segmentation diagram may be obtained.

A feature decoder including a fourth neural network may be disposed in a last portion of a backbone network including a first neural network and a second neural network, or may be inserted behind each intermediate result of the backbone network.

Training data may include "1831" pieces of real face data and "1840" fake face data, and test data may include "569" pieces of real face data and "679" fake face data. In an example of a binary classification task, the highest accuracy of a test operation may be "94.631". An accuracy of supervised learning to which image segmentation is added may be "96.3141".

Figure 13:
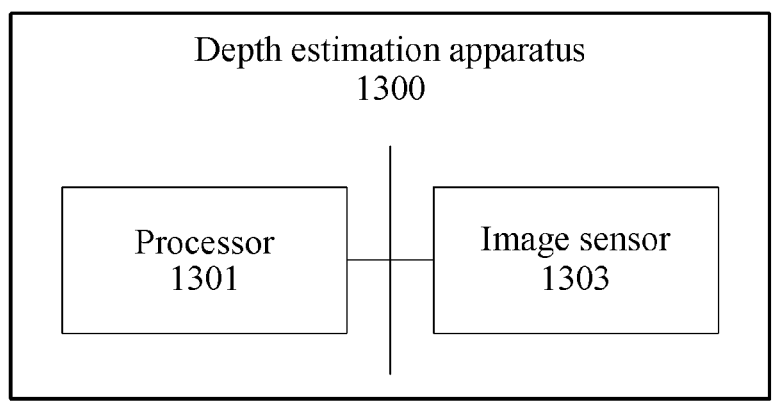
FIG. 13 illustrates an example of a configuration of a depth estimation apparatus.

FIG. 13 illustrates an example of a configuration of a depth estimation apparatus 1300.

Referring to FIG. 13, the depth estimation apparatus 1300 may estimate a depth based on a single full pixel multi-core camera (for example, a phase detection camera). The depth estimation apparatus 1300 may have fewer hardware requirements and may also have low power consumption and low cost, in comparison to a binocular camera scheme or a depth sensor scheme. In addition, the depth estimation apparatus 1300 may obtain a plurality of same sub-images through preprocessing of an original image, and may calculate an effective viewpoint difference in a plurality of directions through a pairing scheme. The depth estimation apparatus 1300 may generate artificial composite data to solve a problem of a lack of training data. The depth estimation apparatus 1300 may additionally have a multi-task learning function, for example, image segmentation or edge detection. Through a DNN training scheme, the depth estimation apparatus 1300 may achieve a one-to-one correspondence relationship at a level of an upper pixel from a viewpoint difference map to a depth map.

In an example, the depth estimation apparatus 1300 may include at least one processor 1301 and an image sensor 1303. The image sensor 1303 may include a plurality of upper pixels, and each of the upper pixels may include "N" sub-pixels. The image sensor 1303 may obtain an original image.

The processor 1301 may obtain "N" sub-images respectively corresponding to the "N" sub-pixels from the original image. For example, "N" may be "4", and four sub-pixels included in each of the upper pixels may be disposed in an upper left end, a lower left end, an upper right end and a lower right end of each of the upper pixels. In an example, the "N" sub-images may include a sub-image corresponding to an upper left sub-pixel, a sub-image corresponding to a lower left sub-pixel, a sub-image corresponding to an upper right sub-pixel, and a sub-image corresponding to a lower right sub-pixel.

The processor 1301 may obtain a viewpoint difference between the N sub-images using a first neural network. The processor 1301 may pair the "N" sub-images. The processor 1301 may obtain a viewpoint difference between the paired sub-images.

In an example, the processor 1301 may obtain a difference value of sub-pixels at corresponding positions between the paired sub-images. The processor 1301 may obtain the viewpoint difference between the paired sub-images based on the difference value.

In another example, the processor 1301 may perform a convolution operation on each of the paired sub-images. The processor 1301 may obtain a difference value of sub-pixels at corresponding positions between result images obtained by performing the convolution operation. The processor 1301 may obtain the viewpoint difference between the paired sub-images based on the difference value.

In another example, the processor 1301 may perform a shift operation on each of the paired sub-images. The processor 1301 may obtain a difference value of sub-pixels at corresponding positions between result images obtained by performing the shift operation. The processor 1301 may obtain the viewpoint difference between the paired sub-images based on the difference value. The shift operation may be an operation of applying a value of a shift in the same direction or a value of a shift in a different direction to each of paired sub-images.

In another example, the processor 1301 may perform a shift operation on each of the paired sub-images. The processor 1301 may perform a convolution operation on each of result images obtained by performing the shift operation. The processor 1301 may obtain a difference value of sub-pixels at corresponding positions between result images obtained by performing the convolution operation. The processor 1301 may obtain the viewpoint difference between the paired sub-images based on the difference value.

The processor 1301 may obtain a depth map of the original image based on the viewpoint difference using a second neural network. In addition, the processor 1301 may obtain an edge detection diagram based on the depth map of the original image using a third neural network. The processor 1301 may obtain an image segmentation diagram based on the depth map of the original image using a fourth neural network.

The apparatuses, units, modules, devices, and other components described herein are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, multiple-instruction multiple-data (MIMD) multiprocessing, a controller and an arithmetic logic unit (ALU), a DSP, a microcomputer, an FPGA, a programmable logic unit (PLU), a central processing unit (CPU), a graphics processing unit (GPU), a neural processing unit (NPU), or any other device capable of responding to and executing instructions in a defined manner.

The methods that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In an example, the instructions or software includes at least one of an applet, a dynamic link library (DLL), middleware, firmware, a device driver, an application program storing the depth estimation method. In another example, the instructions or software include higher-level code that is executed by the processor or computer using an interpreter. Programmers of ordinary skill in the art can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and providing the instructions or software and any associated data, data files, and data structures to a processor or computer so that the processor or computer can execute the instructions.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A depth estimation method comprising:
obtaining an image from an image sensor comprising upper pixels, each comprising N sub-pixels;
obtaining N sub-images respectively corresponding to the N sub-pixels from the image;
obtaining a viewpoint difference between the N sub-images using a first neural network; and
obtaining a depth map of the image based on the viewpoint difference using a second neural network.

2. The depth estimation method of claim 1, wherein the obtaining of the viewpoint difference comprises:
pairing the N sub-images; and
obtaining a viewpoint difference between the paired sub-images.

3. The depth estimation method of claim 2, wherein the obtaining of the viewpoint difference between the paired sub-images comprises:
obtaining a difference value of sub-pixels at corresponding positions between the paired sub-images; and
obtaining the viewpoint difference between the paired sub-images based on the difference value.

4. The depth estimation method of claim 2, wherein the obtaining of the viewpoint difference between the paired sub-images comprises:
performing a convolution operation on each of the paired sub-images;
obtaining a difference value of sub-pixels at corresponding positions between result images obtained by performing the convolution operation; and
obtaining the viewpoint difference between the paired sub-images based on the difference value.

5. The depth estimation method of claim 2, wherein the obtaining of the viewpoint difference between the paired sub-images comprises:
performing a shift operation on each of the paired sub-images;
obtaining a difference value of sub-pixels at corresponding positions between result images obtained by performing the shift operation; and
obtaining the viewpoint difference between the paired sub-images based on the difference value.

6. The depth estimation method of claim 2, wherein the obtaining of the viewpoint difference between the paired sub-images comprises:
performing a shift operation on each of the paired sub-images;
performing a convolution operation on each of result images obtained by performing the shift operation;
obtaining a difference value of sub-pixels at corresponding positions between result images obtained by performing the convolution operation; and
obtaining the viewpoint difference between the paired sub-images based on the difference value.

7. The depth estimation method of claim 1, further comprising:
obtaining an edge detection diagram based on the depth map of the image using a third neural network.

8. The depth estimation method of claim 1, further comprising:
obtaining an image segmentation diagram based on the depth map of the image using a fourth neural network.

9. The depth estimation method of claim 5, wherein the shift operation is performed to apply a value of a shift in a same direction or a value of a shift in a different direction to each of the paired sub-images.

10. The depth estimation method of claim 1, wherein:
N is equal to "4",
four sub-pixels included in each of the upper pixels are disposed in an upper left end, a lower left end, an upper right end and a lower right end of each of the upper pixels, and the four sub-images comprise a sub-image corresponding to an upper left sub-pixel, a sub-image corresponding to a lower left sub-pixel, a sub-image corresponding to an upper right sub-pixel, and a sub-image corresponding to a lower right sub-pixel.

11. A non-transitory computer-readable storage medium storing instructions that, when executed by a processor, cause the processor to perform a method comprising:
obtaining an image from an image sensor comprising upper pixels, each comprising N sub-pixels;
obtaining N sub-images respectively corresponding to the N sub-pixels from the image;
obtaining a viewpoint difference between the N sub-images using a first neural network; and
obtaining a depth map of the image based on the viewpoint difference using a second neural network.

12. A depth estimation apparatus comprising:
an image sensor comprising a plurality of upper pixels, each comprising N sub-pixels, and the image sensor being configured to obtain an image; and
a processor configured to
obtain N sub-images respectively corresponding to the N sub-pixels from the image;
obtain a viewpoint difference between the N sub-images using a first neural network; and
obtain a depth map of the image based on the viewpoint difference using a second neural network.

13. The depth estimation apparatus of claim 12, wherein the processor is further configured to:
pair the N sub-images; and
obtain a viewpoint difference between the paired sub-images.

14. The depth estimation apparatus of claim 13, wherein the processor is further configured to:
obtain a difference value of sub-pixels at corresponding positions between the paired sub-images; and
obtain the viewpoint difference between the paired sub-images based on the difference value.

15. The depth estimation apparatus of claim 13, wherein the processor is further configured to:
perform a convolution operation on each of the paired sub-images;
obtain a difference value of sub-pixels at corresponding positions between result images obtained by performing the convolution operation; and
obtain the viewpoint difference between the paired sub-images based on the difference value.

16. The depth estimation apparatus of claim 13, wherein the processor is further configured to:
perform a shift operation on each of the paired sub-images;
obtain a difference value of sub-pixels at corresponding positions between result images obtained by performing the shift operation; and
obtain the viewpoint difference between the paired sub-images based on the difference value.

17. The depth estimation apparatus of claim 13, wherein the processor is further configured to:
perform a shift operation on each of the paired sub-images;
perform a convolution operation on each of result images obtained by performing the shift operation;
obtain a difference value of sub-pixels at corresponding positions between result images obtained by performing the convolution operation; and
obtain the viewpoint difference between the paired sub-images based on the difference value.

18. The depth estimation apparatus of claim 12, wherein the processor is further configured to obtain an edge detection diagram based on the depth map of the image using a third neural network.

19. The depth estimation apparatus of claim 12, wherein the processor is further configured to obtain an image segmentation diagram based on the depth map of the image using a fourth neural network.

20. The depth estimation apparatus of claim 16, wherein the shift operation is performed to apply a value of a shift in a same direction or a value of a shift in a different direction to each of the paired sub-images.

* * * * *